United States Patent [19]

Kolman et al.

[11] Patent Number: 5,531,021

[45] Date of Patent: Jul. 2, 1996

[54] METHOD OF MAKING SOLDER SHAPE ARRAY PACKAGE

[75] Inventors: Frank Kolman, Phoenix, Ariz.; Kevin Haley, San Jose, Calif.

[73] Assignee: Intel Corporation, Santa Clara, Calif.

[21] Appl. No.: 366,801

[22] Filed: Dec. 30, 1994

[51] Int. Cl.$^6$ .................................................. H01K 3/10
[52] U.S. Cl. .................... 29/843; 29/852; 228/180.21; 228/180.22; 439/66; 439/67
[58] Field of Search ........................... 29/842, 843, 844, 29/852; 439/66, 67; 228/180.21, 180.22

[56] References Cited

U.S. PATENT DOCUMENTS

| | | | |
|---|---|---|---|
| 3,541,222 | 11/1970 | Parks et al. | 439/66 X |
| 5,155,905 | 10/1992 | Miller, Jr. | 29/842 X |
| 5,207,585 | 5/1993 | Byrnes et al. | 439/66 |
| 5,244,143 | 9/1993 | Ference et al. | 228/180.21 |

*Primary Examiner*—Carl J. Arbes
*Attorney, Agent, or Firm*—Blakely, Sokoloff, Taylor & Zafman

[57] ABSTRACT

A surface mount package for an electronic device has an array of solder shapes or structures projecting from the bottom surface of the package. The solder structures are cast in place on the package substrate using a wave solder process. The solder also fills via holes in the substrate at each solder structure site. An integrated circuit is bonded to the top surface of the substrate using a conventional tape automated bonding (TAB) process or other suitable bonding process. The preferred shape of the solder structure is a cone, but other shapes, including hemispheres, columns and pyramids can be produced using a mold with suitably shaped cavities. The mold is preferably as large as an entire substrate panel so that a large number of device sites can be processed simultaneously.

18 Claims, 2 Drawing Sheets

METHOD OF MAKING SOLDER SHAPE ARRAY PACKAGE

BACKGROUND OF THE INVENTION

1. Field of the Invention

This invention relates generally to electronic devices, and particularly to packaging of such devices. More specifically, the invention provides a solder shape array package for high pin count integrated circuit devices.

2. Background Art

Advances in semiconductor processing technology have provided devices of ever increasing complexity. Generally speaking, more complex integrated circuit devices have a greater number of input/output (I/O) signals. Consequently, the increasing complexity of integrated circuits poses a challenge in terms of packaging. Aside from the problem of providing a sufficient number of circuit leads to meet the I/O requirements of a particular device, there is the attendant problem of properly bonding a large number of leads to a printed circuit board. Additionally, it is desirable to bond the device to the printed circuit board in a manner that will facilitate subsequent removal for replacement of the device.

Pin grid array packages have become a popular form of integrated circuit packaging since they provide a large number of pins in a plug-in type package. An array of pins is located on a ceramic or plastic substrate and are received by mating sockets on a printed circuit board. The integrated circuit or other semiconductor device is mounted on the top side of the substrate and electrical bonds are made to the individual pins, typically with wire bonding. Maintaining mechanical alignment of the pins and achieving reliable electrical contact between the pins and mating sockets are problems associated with pin grid array packages.

Another type of package for high pin count devices is the pad grid or bump grid package. In this type of package, conductive pads or bumps on the underside of the chip carrier substrate are provided in lieu of pins. The chip carrier substrate in this type of package must meet a stringent flatness requirement in order to ensure that all of the pads make reliable electrical contact with the receiving printed circuit board.

The ball grid array (BGA) package is similar in concept to the pad grid array, but achieves greater mounting compliance by attaching a small solder ball at each of the pad sites. This has proven to be a reliable packaging technique, but poses certain fabrication difficulties. Current surface mount BGA packages are constructed by placing individual solder balls onto an array of substrate pads on which flux and/or solder paste has been deposited. The substrate is then exposed to a temperature sufficient to melt the solder, thereby attaching the individual solder balls to their respective pads. Properly locating the individual solder balls at the pad sites is a difficult process to automate and results in a relatively high-cost package.

The present invention presents an alternative to existing BGA technology by providing a method for constructing a solder shape array surface mount package with the mounting characteristics of a BGA package, but at significantly lower cost.

SUMMARY OF THE INVENTION

The present invention provides a surface mount package with an array of solder shapes or structures projecting from the bottom surface. The solder structures are cast in place on the package substrate using a wave solder process. The solder also fills via holes in the substrate at each solder structure site. An integrated circuit is bonded to the top surface of the substrate using a conventional tape automated bonding (TAB) process or other suitable bonding process.

The preferred shape of the solder structure is a cone, but other shapes, including hemispheres, columns and pyramids can be produced using a mold with suitably shaped cavities. The mold is preferably as large as an entire substrate panel so that a large number of device sites can be processed simultaneously.

The present invention offers a number of significant advantages over conventional BGA and other high pin count packaging technologies. First, all of the solder structures for an entire substrate panel, comprising 40,000 or more contact pads, can be formed in a single casting step. Second, because the solder shapes are cast in place with a single mold, the coplanarity of the shapes is inherently tightly controlled. Third, the volume of solder in the solder structures and within the via holes enhances the thermal conductivity of the package. Fourth, the preferred conical shape of the solder structures maximizes the collapse distance during surface mounting of the packaged device. This is a critical parameter in determining the yield of the surface mount process. Finally, the attachment of the solder structure to a metalized via pad on the substrate is extremely robust in comparison to current BGA packaging technology.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as to not obscure the description of the present invention with unnecessary detail.

Figure 1:
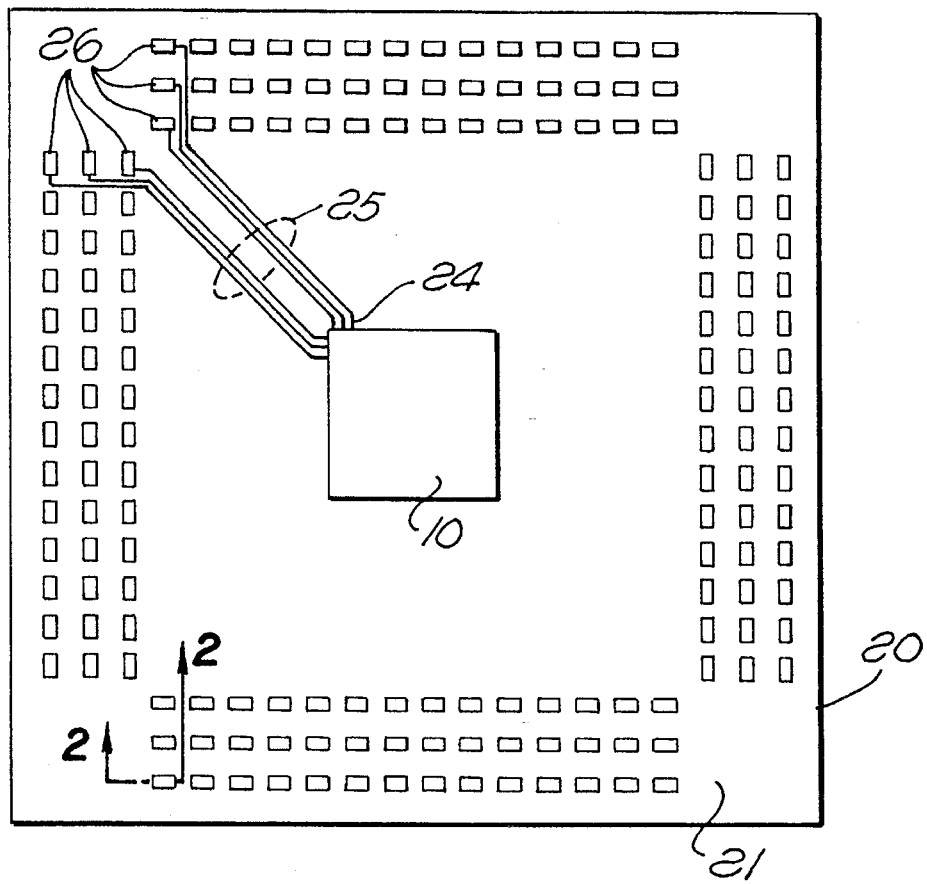
FIG. 1 is an abbreviated top plan view of a package for an electronic device according to the present invention.

FIG. 1 is a top plan view of a mounting apparatus according to the present invention. An electronic device, such as integrated circuit 10, is mounted on the top surface 21 of substrate 20. Integrated circuit 10 is bonded to a lead frame 24 having a plurality of conductive leads 25 radiating outwardly from the integrated circuit. For the sake of clarity, only six of conductive leads 25 are shown in FIG. 1. However, it will be understood that the leads will typically radiate from the entire perimeter of integrated circuit 10, each such lead terminating at a respective outer contact pad 26. Contact pads 26 are arranged in an array that is congruent with an array of via holes in substrate 20 as more fully explained below. Preferably, this array is also congruent with an array of contact pads on a circuit board (not shown) onto which integrated circuit 10 will ultimately be mounted. The bonding of integrated circuit 10 to lead frame 24 is preferably performed using conventional tape automated bonding (TAB) techniques. However, the present invention is not limited in this regard. Any other suitable process for forming circuit leads may be employed, including, for example, wire bonding or flip chip bonding.

Figure 2:
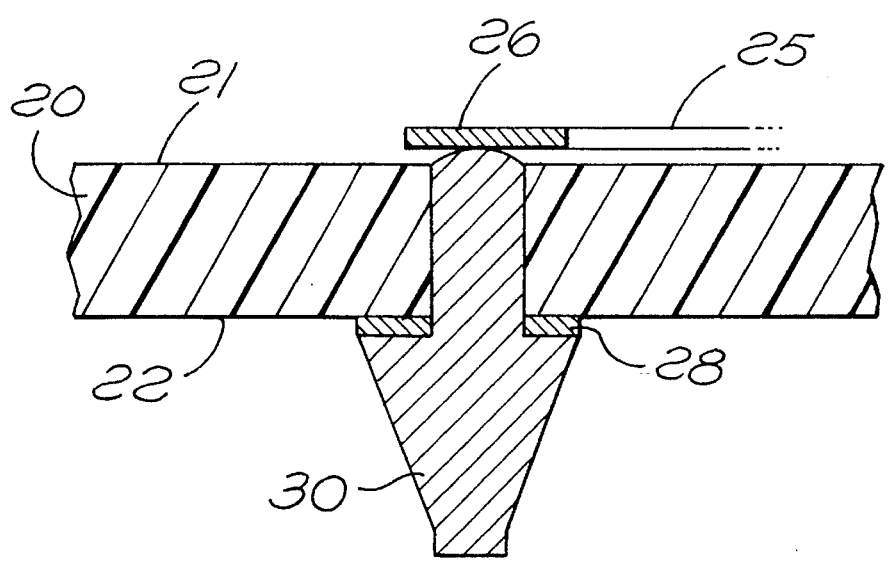
FIG. 2 is a partial cross-sectional view taken through line 2—2 of FIG. 1.

FIG. 2 is a cross-sectional view through substrate 20 at one of the via sites. A via pad 28 is formed on the bottom surface 22 of substrate 20 surrounding each via hole 29. A conductive structure 30 projects from substrate 20 directly below via pad 28. Structure 30 is preferably cast in place with solder that extends through via hole 29 and thereby provides a bonding location on top surface 21 for bonding pad 26.

Figure 3:
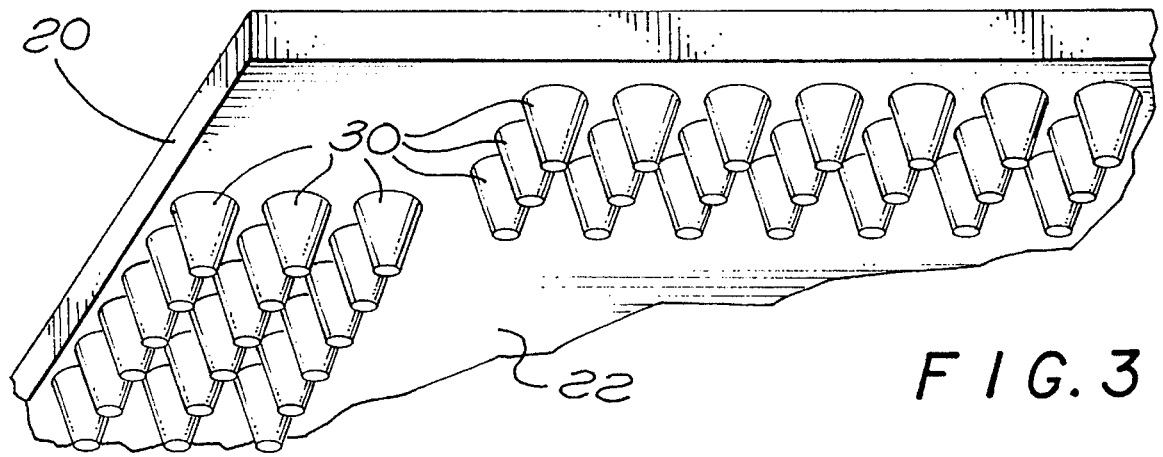
FIG. 3 is a partial perspective view of the bottom surface of the package of FIG. 1.

FIG. 3 is a partial perspective view of bottom surface 22 of substrate 20. A conductive structure 30 projects from surface 22 at each of the via sites. As illustrated here, structures 30 are generally conical in shape and are cast in place at the via sites by the process described below.

Figure 4:
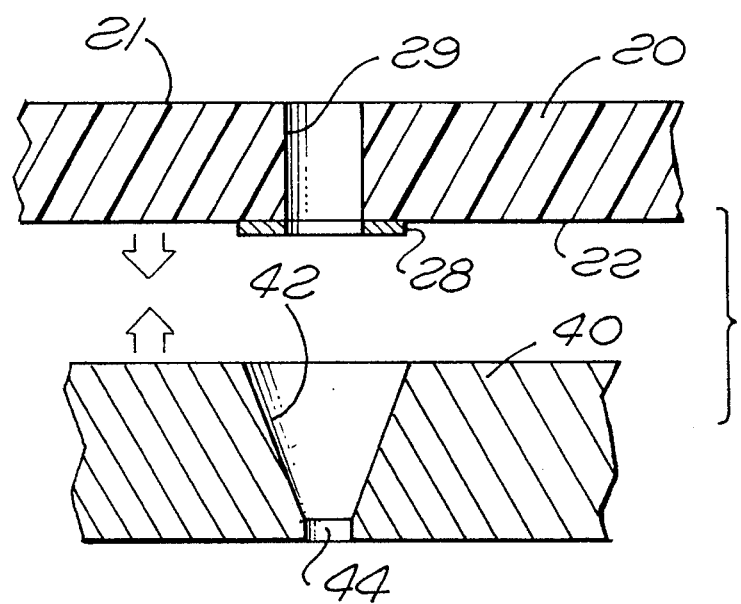
FIG. 4 is a partial cross-sectional view of the package substrate and mold prior to casting the solder shape array.
Figure 5:
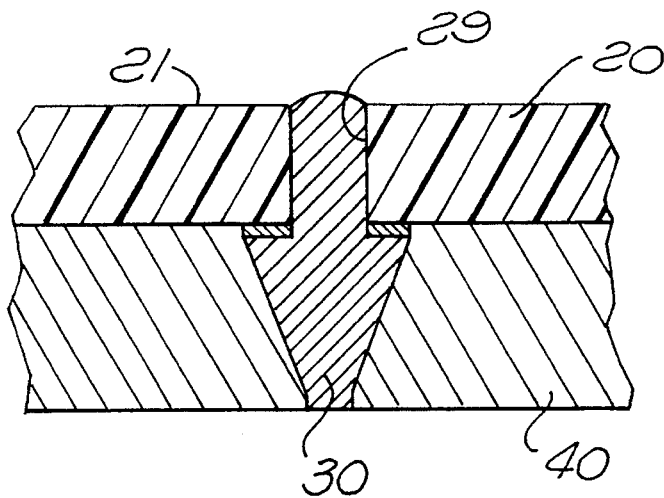
FIG. 5 is a partial cross-sectional view of the substrate and mold at the completion of the casting process.

Referring now to FIGS. 4 and 5, the process for casting structures 30 is illustrated. Prior to the casting process, substrate 20 is prepared with via pads 28 using conventional printed circuit processing techniques and is drilled with via holes 29. Substrate 20 may be fabricated from a sheet of BT resin with a thickness of approximately 0.035 inch. Other materials known in the art, such as FR4, are also suitable for use. In a typical application, via holes 29 are approximately 0.019 inch in diameter on 50 mil centers. Via pads 28 have a diameter of approximately 0.025 inch. Corresponding via pads may also be formed on top surface 21 of substrate 20 to provide a more robust bonding site for the outer bonding pads 26 of the lead frame, and the interior of via hole 29 may be plated using well-known printed circuit techniques to improve solder flow and retention in the vias. Furthermore, additional vias may be provided for signal routing if desired. Indeed, substrate 20 may comprise a multi-layer printed circuit and may have a plurality of integrated circuit devices mounted thereon.

It will be recognized that the outer bonding pads 26 of lead frame 24 need not necessarily align with the array of conductive structures 30. Top surface 21 of substrate 20 may be etched with a conductive pattern connecting via holes 29 with bonding sites for pads 26 that are displaced from the via holes. In this manner, a particular lead frame design may be adapted to different contact grid arrays and vice versa.

Mold 40 is fabricated with a plurality of cavities 42 in an array corresponding to the desired array of structures 30. Each of cavities 42 includes a gate hole 44 through which the cavity will subsequently be filled. Mold 40 is tightly clamped to surface 22 of substrate 20 and cavities 42 are filled with molten solder or other suitable molten conductive material. The solder fills the mold cavity through the gate hole 44 and then fills the via hole 29 by pressure and capillary action. The casting process is preferably performed in a wave solder machine using an oscillating turbulent wave to promote complete filling of cavities 42 and via holes 29. As the substrate leaves the solder wave, the solder at the top of via hole 29 solidifies first and traps the solder in the mold cavity by not allowing a vent path.

Mold 40 is preferably fabricated from a high-temperature polymer or a metal to which molten solder will not adhere. A suitable polymer is "Teflon"-filled "Delrin" available from DuPont. Such a polymer mold would be relatively inexpensive, but will have a limited life, estimated to be on the order of 100–1000 castings. If longer mold life is desired, mold 40 would preferably be machined from titanium, although at substantially greater cost than a polymer mold.

Cavities 42, and therefore structures 30, are preferably substantially conical in shape and have a height of approximately 0.035 inch. A mold for this shape is fairly easy to prepare and is readily released after the casting process is completed. However, other shapes may be employed if desired. For example, structures 30 may also be shaped as hemispheres, columns or pyramids.

After structures 30 have been cast, mold 40 is removed from substrate 20 and integrated circuit 10 is then bonded to top surface 21 using a TAB or other suitable bonding process. The present invention is particularly well suited for high volume production. A 24"×12" panel of substrate material could contain 200 package sites of 1-inch square 200 I/O devices. Mold 40 may be made as large as the substrate panel so that solder structures 30 may be cast for all package sites in a single process. In a preferred process, circuit devices 10 are TAB bonded to each site while the substrate is still in panel form. The device sites are then cut apart. In the preferred process, full frequency device testing and burn-in will have been performed on the device at the TAB level so that only a basic function check of the packaged device is required before shipping.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A method of fabricating an interconnection apparatus for an electronic device having a plurality of bonding leads arranged in a pattern, said method comprising the steps of:

(a) providing a substrate having first and second opposing surfaces;

(b) defining a first array of contact sites on the substrate;

(c) providing a mold having an array of shaped cavities congruent with said first array of contact sites;

(d) clamping said mold against the second surface of the substrate with said array of cavities aligned with said first array of contact sites;

(e) filling said cavities with a molten conductive material;

(f) removing said mold from the substrate after the molten conductive material solidifies, thereby leaving an array of conductive shapes extending from the second surface of the substrate;

(g) forming a conductive path between each of the conductive shapes and a corresponding one of a second array of contact sites on the first surface of the substrate, said secondary array congruent with the pattern of bonding leads of the electronic device.

2. The method of claim 1 wherein the molten conductive material comprises solder.

3. The method of claim 2 wherein the step of filling said cavities of the mold is performed in a wave solder machine.

4. The method of claim 1 wherein the cavities of the mold have a substantially conical shape.

5. The method of claim 1 wherein the substrate comprises a fiber reinforced resin.

6. The method of claim 1 wherein the conductive structures are electrically connected to the corresponding ones of the second array of contact sites through via holes in the substrate.

7. The method of claim 1 further comprising the step of bonding the bonding leads of the electronic device to corresponding ones of the second array of contact sites.

8. The method of claim 1 wherein the mold is made of a plastic.

9. The method of claim 1 wherein the mold is made of titanium.

10. The method of claim 1, further comprising the step, prior to step (d), of forming a metallic pad on the second surface of the substrate at each contact site of said first array.

11. A method of mounting an electronic device having a plurality of bonding leads on a circuit board having a plurality of contact pads arranged in a pattern, said method comprising the steps of:

(a) providing a substrate having first and second opposing surfaces;

(b) forming a plurality of via holes between the first and second surfaces of the substrate in an array congruent with the pattern of contact pads;

(c) providing a mold having a plurality of shaped cavities disposed in an array congruent with the array of via holes;

(d) clamping said mold against the second surface of the substrate with said array of cavities aligned with said array of via holes;

(e) filling said cavities and corresponding via holes with a molten conductive material;

(f) removing said mold from the substrate after the molten conductive material solidifies, thereby leaving a conductive shape extending from the second surface of the substrate at each via hole;

(g) conductively coupling the bonding leads of the electronic device to corresponding filled via holes on the first surface of the substrate;

(h) mounting the substrate on the circuit board with the conductive shapes extending from the second surface of the substrate in mating contact with corresponding contact pads on the circuit board.

12. The method of claim 11 wherein the molten conductive material comprises solder.

13. The method of claim 12 wherein the step of filling said cavities of the mold is performed in a wave solder machine.

14. The method of claim 11 wherein the cavities of the mold have a substantially conical shape.

15. The method of claim 11 wherein the substrate comprises a fiber reinforced resin.

16. The method of claim 11 wherein the mold is made of a plastic.

17. The method of claim 11 wherein the mold is made of titanium.

18. The method of claim 11, further comprising the step, prior to step (d), of forming a metallic pad surrounding each via hole.

* * * * *